US005401676A

United States Patent [19]

Lee

[11] Patent Number: 5,401,676

[45] Date of Patent: Mar. 28, 1995

[54] METHOD FOR MAKING A SILICON FIELD EMISSION DEVICE

[75] Inventor: Kang-ok Lee, Suwon, Rep. of Korea

[73] Assignee: Samsung Display Devices Co., Ltd., Kyunggi, Rep. of Korea

[21] Appl. No.: 114,134

[22] Filed: Aug. 30, 1993

[30] Foreign Application Priority Data

Jan. 6, 1993 [KR] Rep. of Korea ........................ 93-83

[51] Int. Cl.$^6$ ........................................ H01L 21/44

[52] U.S. Cl. ........................ 437/200; 437/89; 313/311; 445/49; 445/50

[58] Field of Search .................. 437/200, 89; 313/311, 313/312; 445/49, 50

[56] References Cited

U.S. PATENT DOCUMENTS

| | | | |
|---|---|---|---|
| 3,669,241 | 6/1972 | Chalich | 198/102 |
| 3,755,704 | 8/1973 | Spindt et al. | 313/309 |
| 3,970,887 | 7/1976 | Smith et al. | 313/309 |
| 3,998,678 | 12/1976 | Fukase et al. | 156/3 |
| 4,964,946 | 2/1990 | Gray et al. | 156/643 |
| 5,186,670 | 2/1993 | Doan et al. | 445/24 |
| 5,188,977 | 2/1993 | Stengl et al. | 437/89 |
| 5,229,331 | 7/1993 | Doan et al. | 437/228 |
| 5,232,549 | 8/1993 | Cathey et al. | 456/663 |
| 5,259,799 | 11/1993 | Doan et al. | 445/24 |

OTHER PUBLICATIONS

"Formation of Silicon Tips With <1 nm. Radius", R. B. Marcus et al., Applied Phys. Lett., vol. 56, No. 3, Jan. 15, 1990, pp. 236–238.

Wolf et al., vol. I., Silicon Processing for the VLSI Era Lattice Press, 1986, pp. 377–383.

*Primary Examiner*—Brian E. Hearn
*Assistant Examiner*—Lynne A. Gurley
*Attorney, Agent, or Firm*—Christie, Parker & Hale

[57] ABSTRACT

A method is disclosed for making a silicon emission emitter for use as electron sources for various display elements, light sources, high-speed switching devices, and micro-sensors. The method relates to the formation of a tip portion of an emitter and an electron range by using a silicide material having a high melting point and a low work function. The emitter tip and electron range formed by the silicide material is a predetermined distance away from an oxide film, therefore, the emission characteristic of the emitter is efficiently strengthened, and the leakage current is, thereby, reduced due to the prevention of the metallic contamination to the insulating layers.

4 Claims, 3 Drawing Sheets

METHOD FOR MAKING A SILICON FIELD EMISSION DEVICE

BACKGROUND OF THE INVENTION (1) Field of the Invention

The present invention relates to a field emission emitter to emit electrons by a field effect among electron sources utilized for various display elements, light sources, high speed switching devices, micro sensors, and so on. More particularly, it relates to a method for making a silicon field emission emitter which uses a plating material or a metal silicide on a tip of the emitter to enforce or change characteristics of a tip of a silicon field emitter.

(2) Description of the Related Art

Recently, attention is concentrated on the substitution of an inefficient thermionic emitter for a high field emission emitter. The emitter is very efficient since an emitter material does not need to be heated. The emitter has been used for scanning sources of an electronic microscope for several years, and the emitter is now being developed as a source for a vacuum microelectron device, a flat panel display, and a high efficiency and frequency vacuum tube.

The field emission emitter may have very high luminous efficiency and luminance by making a point of the field emission material of which a radius is less than about 100 nanometer high-integrated to $10^4$–$10^5$ Tips/mm$^2$, and thus is thought as a very suitable display device for the embodiment of wall television sets owing to a low voltage consumption.

An emitter tip has a generally cone-shaped structure, and methods for constructing the emitter tip are classified as four categories as follows.

A first category is a very initial category that the emitter tip is formed by a direct deposition of the material. The embodiment for the first category is mentioned in pages 3504–3505, No. 7, Vol. 39, Journal of Applied Physics, a paper by C. A. Spint, "THIN FILM FIELD EMISSION CATHODE", and a similar process to the above-mentioned one is depicted in a U.S. Pat. No. 3,755,704.

A second category is to use anisotropic etching of a single crystalline material as a silicon disclosed in a U.S. Pat. No. 3,669,241.

A third category is to use isotropic etching which forms the above-mentioned construction. The embodiment for the third category is disclosed in a U.S. Pat. No. 3,998,678.

A forth category is to form the tip by oxidizing the emitter material. The embodiment for the four category is disclosed in a U.S. Pat. No. 3,970,887.

To be brief, as the structure of the typical field emission emitter is shown in FIG. 1, a cone-shaped microtip emitter is made. A reference numeral 11 indicates a silicon substrate doped with impurities of high density and having high conductively rate. Also, the cone shaped emitter 17 is formed within a cavity 15 in an insulating layer 13 on the silicon substrate. In addition, the emitter is encompassed by a control and extract electrode, and by a gate electrode 19.

All the silicon field emission emitters made by the forth Categories have some limitations. Namely, to obtain the field emission of high efficiency, two conditions, for example, a first condition that a component of the emitter tip have a low work function and a second structural condition that a gate aperture be small, should be satisfied. However, the emission efficiency can not be low because the silicon microtip emitters have a lot of factors hindering the first condition—a low melting point, a low electric conductivity and a high work function. In addition, the silicon emitter tip having a sharp point is apt to be worn away, or be broken off because the silicon emitter tip is sensitive to the impurity and a mechanical strength.

In this point of view, as shown in FIG. 2, to strengthen and vary the characteristic of the emitter (to improve the work function), recently, a study on a newly constructed field emission emitter 17 which a refractory metal silicide layer 20 is formed on a upper part of the emitter is being lively made. But, this emitter also has a following problem. Namely, when metallic material for forming the silicide layer is deposited, the metallic material is deposited on a wall of the insulating layer 13 in the cavity 15 as well as on an entire surface of the emitter 17. Thus, in an annealing process for forming the silicide layer that is a thermally-treated compound of the metal and the silicon, the metallic material is easily diffused to the insulating layer, so that it results in reducing an electronic insulation effect, increasing the leaked current and reducing breakdown voltage. (Refer to IVMC 92' paper, "*Gated Silicon Field Emitter Tip Technology*" by R. B. Marcus et al.)

SUMMARY OF THE INVENTION

An object of this invention is to provide a method for making a silicon field emission emitter which can maximize emission efficiency by strengthening the characteristic of an electron emission emitter and reducing a work function of an emitter material, and maximize insulating effect by removing metallic impurities to insulating layers.

To accomplish this object, a method for forming at least one silicon field emission emitter comprises the steps of:

- forming oxide masks by photo etching after thermal oxidation of a highly doped silicon substrate;
- carrying out dry etching of the silicon substrate and a sharpening oxidation process to form cone shaped emitters with a point centered;
- etching the oxide layers the masks;
- depositing multi-insulating layers on the substrate and upper portion of the emitter;
- multi-stages etching the insulating layers on the emitter to expose the cone shaped emitter;
- depositing a metal for forming a gate electrode on the insulting layers and a thin metal film on the tip of the emitter by electron beam evaporation inclined less than 45 degrees against a horizontal level; and
- annealing to form a metal silicide layer on the tip of the emitter.

DETAILED DESCRIPTION OF THE PREFERRED EMBODIMENT

Figure 1:
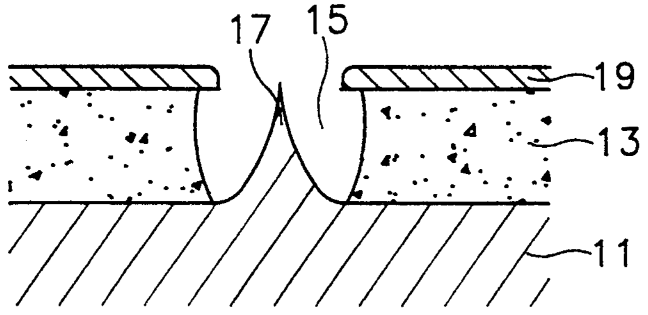
FIG. 1 (Prior Art)
FIG. 1 is a sectional view illustrating a structure of a prior art silicon field emission emitter.
Figure 2:
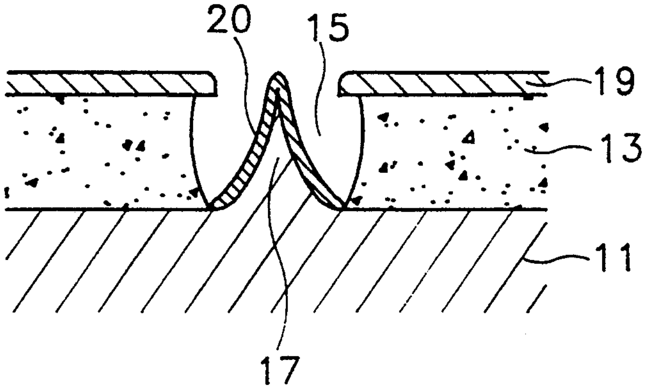
FIG. 2 (Prior Art)
FIG. 2 is a sectional view illustrating a structure of a silicon field emission emitter which strengthens an emitter characteristic of FIG. 1.
Figure 3:
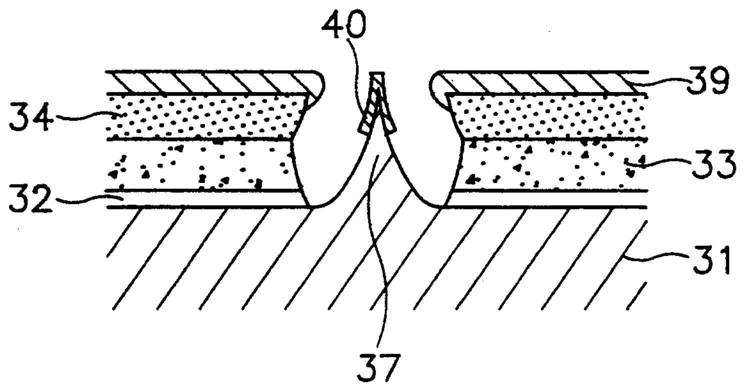
FIG. 3 is a sectional view illustrating a structure of a silicon field emission emitter in accordance with the embodiment of the present invention.

Referring to FIG. 3, a silicon field emission emitter in accordance with the embodiment of the present invention includes multi-structures insulating layers formed on a highly doped silicon substrate 31. The insulating layers include a nitride film 32 of 1000–2200 angstroms, an oxide film 33 of about 5000–9000 angstroms and a dielectric film 34 of about 3000–5000 angstroms. A refractory silicide layer 40 of a low work function, a thermally-treated compound of metal and silicon are formed on only a tip of a cone shaped emitter 37. An actual electron emission range and a gate electrode 39 are formed around the silicide layer 40.

FIGS. 4A to 4H are sectional views illustrating steps for making a silicon field emission emitter in accordance with the embodiment of the present invention.

Figure 4A:
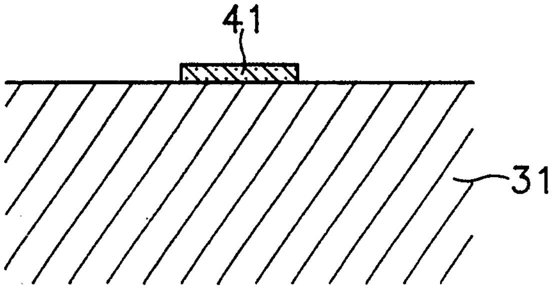
FIGS. 4A to 4H are sectional views illustrating steps for making a silicon field emission emitter in accordance with the embodiment of the present invention.

A first step is forming an oxide mask 41 (FIG. 4A). A single crystalline substrate 31, e.g., a highly doped N-type silicon substrate having resistivity of several Ω-cm, is thermally oxidized to form an oxide film of about 1200 angstroms. The oxide mask 41 used for self-alignment at the time of the following etching process is then formed through photo-etching.

Figure 4B:
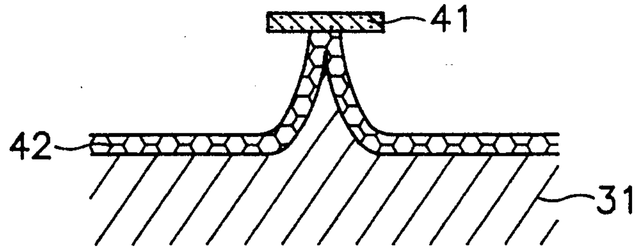

A second step is etching the silicon substrate by reactive ion etching to allow control of the emitter aspect ratio and form cone-shaped emitter by means of the oxide mask 41 (FIG. 4B). The single crystalline substrate 31 under the oxide mask 41 is selectively etched in the horizontal and vertical directions at a predetermined rate. The configuration of the silicon emitter having sharp edge or tip of the conical structure is determined by the selective etch rate and the shape of the mask.

A third step is a sharpening oxidation process for forming a thermal oxide film 42 to sharpen the emitter having a plane tip (FIG. 4B). A profile of the thermal-oxide film 42 is the same as the selective etching profile, and in the following process, and the thermal oxide film 42 is removed to keep the sharp tip profile of the silicon emitter.

Figure 4C:
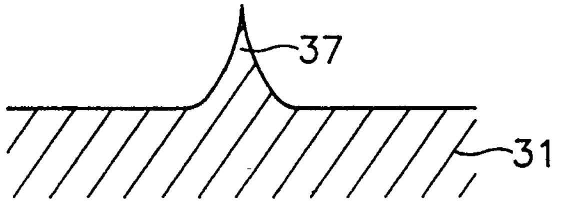
Figure 4D:
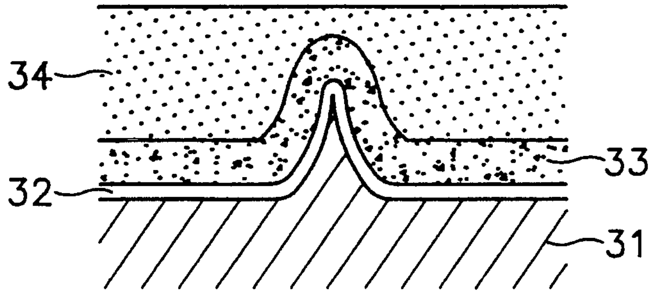

A fourth step is a wet etching process for removing the thermal oxide film 42 and the oxide mask 41 except the cone-shaped emitter 37 formed with the substrate 31 as one body by the above-mentioned steps, as shown in FIG. 4C.

A fifth step is forming multi-insulating layers on the substrate 31 and the upper portion of the emitter 37 by a chemical vapor deposition method. First, a nitride film 32 is formed on the substrate 31 and the upper portion of the emitter 37 by depositing $Si_3N_4$ of 1000–2200 angstroms by a low pressure chemical vapor deposition (CVD) method, and then an oxide film 33 of 0.5–0.9 $\mu m$ and a dielectric film 34 of 1–2 $\mu m$ are formed on the nitride film 32 by successively depositing $SiO_2$ and polyimide by a plasma enhanced CVD method or a spin coating method.

Figure 4E:
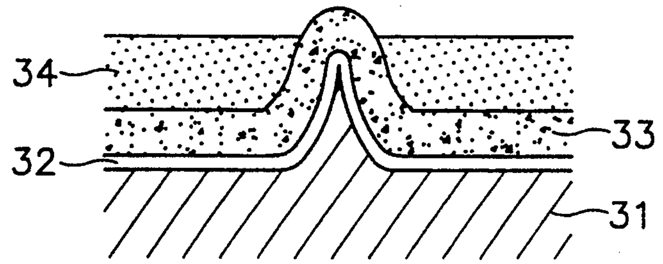
Figure 4F:
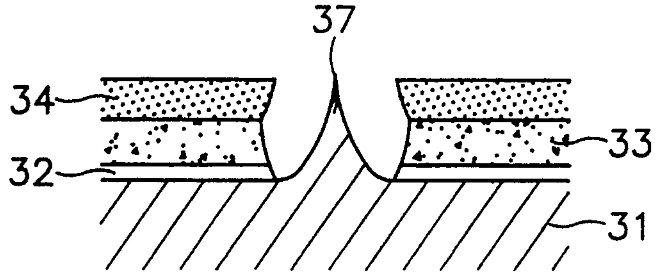

A sixth step is carrying out multi-stages etching process for exposing the cone-shaped emitter 37. First, as shown in FIG. 4E, the dielectric film 34 is etched to the extent of 3000–5000 angstroms to make the $SiO_2$ layer 33 be exposed. Second, oxide film 33 and the nitride film 32 are wet etched by using the remaining dielectric film 34 as a mask, and then the field emission emitter 37 is exposed, as shown in FIG. 4F. An aperture of a cavity formed at this point is determined by the selective etch rate or etch condition of each insulating layers.

Figure 4G:
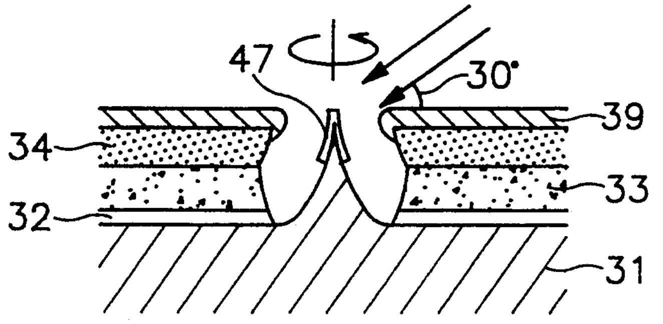

A seventh step is forming a gate electrode 39 by inclinatorily depositing a gate metal by less than 45 degrees against a horizontal level, and forming a thin metal film 47 which shall be changed to the thermally-treated compound with the silicon through an annealing process on the tip of the emitter 47 (FIG. 4G). At this point, the deposition angle may be varied in accordance with the aperture of the cavity. In the preferable embodiment of the present invention, the deposition angle is set in about 25–30 degrees against the horizontal level. Accordingly, the structure of the gate electrode 39 is formed by a shape that reduces the diameter of the aperture in accordance with the deposition angle, namely, is formed by the shape of being inclinatorily projected to the direction of the tip metal 47, and the tip metal 47 may be formed around the sharply pointed tip, the actual range where the electron is emitted. Meantime, one of metals having a high melting point, Cr, Mo, Nb, Ta, Ti, W and Zr can be applied as the gate metal in the above-mentioned process.

Figure 4H:
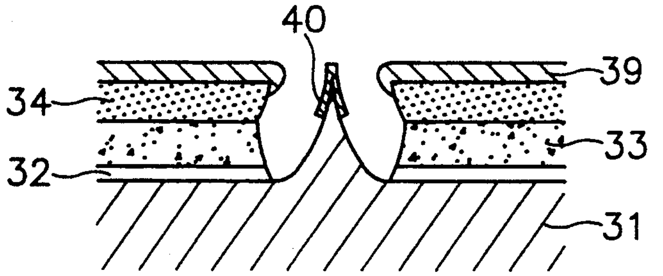

A final step is forming a metal silicide layer 40 at the boundary of the tip metal 47 and the silicon emitter 37 by annealing in a high temperature furnace, as shown in FIG. 4H. The silicide layer formed at this time is formed in accordance with the kind of the gate metal, namely, one of $CrSi_2$, $MoSi_2$, $TaSi_2$, $WSi_2$ and $ZrSi_2$ is formed. As a result of that, it is possible to efficiently strengthen the emission characteristic of the emitter, and at the same time, the field emission emitter is made which can block the permeation of the metal component to the insulating layers.

As described in the above, the present invention has advantages that a silicide material having the high melting point and the low work function is formed on the tip of the emitter, the electron emission range, so that results in strengthening the characteristic of the field emission emitter and maximizing emission efficiency. The silicide material is formed a predetermined distance from the insulating layers film, thus the leakage current can be reduced due to the prevention of the metallic impurity to the insulating layers.

What is claimed is:

1. A method for forming a silicon field emission emitter comprising the steps of:
- forming oxide masks by photo etching after thermal oxidation of a silicon substrate;
- carrying out dry etching of the silicon substrate and a sharpening oxidation process to form a cone shaped emitter with a point centered;
- etching the oxide layer and said masks;
- depositing multi-insulating layers on said substrate and upper portion of the emitter;
- etching, in multi-stages, the insulating layers on the emitter to expose said cone shaped emitter;
- depositing a metal for forming a gate electrode on said insulating layers and a thin metal film on the tip of the emitter by electron beam evaporation inclined less than 45 degrees against a horizontal level; and
- annealing to form a metal silicide layer on the tip of the emitter.

2. Method for forming a silicon field emission emitter as claimed in claim 1, wherein said multi-insulating layers are formed having a three stage structure of polyimide, $SiO_2$ and $Si_3N_4$.

3. Method for forming a silicon field emission emitter as claimed in claim 2, wherein the thickness of said $Si_3N_4$ is 1000 to 2200 angstroms.

4. Method for forming a silicon field emission emitter as claimed in claim 1, wherein the inclination of the metal deposition angle is 25 to 30 degrees.

* * * * *